(12) United States Patent
Tsai et al.

(10) Patent No.: US 7,598,524 B2
(45) Date of Patent: *Oct. 6, 2009

(54) THIN FILM TRANSISTOR WITH ELECTRODE ADHESION LAYERS

(75) Inventors: Wen-Ching Tsai, Hsin-Chu (TW);
Kuo-Lung Fang, Hsin-Chu (TW);
Han-Tu Lin, Hsin-Chu (TW);
Chia-Sheng Lee, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/218,631

(22) Filed: Sep. 6, 2005

(65) Prior Publication Data

US 2006/0226484 A1    Oct. 12, 2006

(30) Foreign Application Priority Data

Apr. 6, 2005 (TW) ............................ 094110918 A

(51) Int. Cl.
*H01L 31/00* (2006.01)
(52) U.S. Cl. .......................................... 257/59; 257/72
(58) Field of Classification Search .................... 257/66, 257/72, 762, 59, 347
See application file for complete search history.

(56) References Cited

U.S. PATENT DOCUMENTS 6,468,822 B2   10/2002   Maeda et al.
2001/0030717 A1*  10/2001   Kaneko et al. ................. 349/43
2002/0042167 A1*   4/2002   Chae ........................... 438/149
2002/1011769    *   8/2002   Choi et al. .................... 257/225
2002/0151174 A1*  10/2002   Jeong et al. .................. 438/686
2004/0178411 A1*   9/2004   Misaki et al. .................. 257/72
2006/0263949 A1*  11/2006   Tsai et al. .................... 438/149

FOREIGN PATENT DOCUMENTS

| CN | 1610859 | 4/2005 |
|---|---|---|
| CN | 1651985 | 8/2005 |
| WO | WO03/056385 | 7/2003 |
| WO | WO2004/061991 | 7/2004 |

OTHER PUBLICATIONS

Communication from the Chinese Patent Office dated Jul. 25, 2008 with regard to the counterpart Chinese Application 2005100667919.

* cited by examiner

*Primary Examiner*—Kenneth A Parker
*Assistant Examiner*—Anthony Ho
(74) *Attorney, Agent, or Firm*—Rosenberg, Klein & Lee

(57) ABSTRACT

A thin film transistor (TFT) is disclosed, and the thin film transistor comprises: a substrate, a gate electrode, a first adhesion layer, a gate insulting layer, a semiconductor layer, and a source electrode and a drain electrode. The gate electrode is formed on the substrate, and the gate electrode is made of silver. The first adhesion layer is formed between the substrate and the gate electrode. A gate insulating layer is formed on the gate electrode. The semiconductor layer is formed on the gate insulating layer. The source electrode and the drain electrode are formed on parts of the semiconductor layer. Accordingly, the reliable TFT is provided through having the Ag metal with low resistivity and good adhesion characteristics.

38 Claims, 4 Drawing Sheets

THIN FILM TRANSISTOR WITH ELECTRODE ADHESION LAYERS

CROSS-REFERENCE TO RELATED PATENT APPLICATIONS

The Applicant of the present Utility Patent Application claims the benefit of priority based on Foreign Application No. 094110918 filed on 6 Apr. 2005 in the Republic of China.

FIELD OF THE INVENTION

The present invention generally relates to a thin film transistor and, more particularly, relates to a thin film transistor having low resistance and good adhesion characteristics.

BACKGROUND OF THE INVENTION

As the semiconductor design and the manufacture technique update, the rate of improvement in components accelerates, and the size of panel and the resolution of TFT-LCD increase, the distortion of the gate pulse signal due to the resistance-capacitance (RC) signal delays will increase. To decrease the RC signal delays, low resistance material for the connection between the components must be chosen. As the density of the components increases, the line width of the connection will decrease to induce the electromigration problems by high current density, so that it becomes a factor in choosing the material. Generally speaking, the conventional connection material is aluminum (Al) which resistivity is about 2.66 μΩ-cm. But using copper (1.67 μΩ-cm) or silver instead of aluminum for connection material is regarded as a practicable proposal gradually because copper and silver have higher resistance-to-electromigration and lower resistivity than aluminum.

Referring to FIG. 1, a schematic view of a conventional thin film transistor is illustrated. The conventional thin film transistor comprises a substrate 11, a gate electrode 12, a gate insulating layer 13, a semiconductor layer 14, a source electrode 15, and a drain electrode 16. A gate metal is sputtered by physical vapor deposition (PVD) on the substrate 11. After patterning the gate metal by a first photolithography process to form the gate electrode 12, the gate insulating layer 13 and the semiconductor layer 14 are then sequentially deposited on the substrate 11 by Plasma Enhanced Chemical Vapor Deposition (PECVD) and patterned by a second photolithography process. Then, a second metal layer (source/drain) is sputtered and patterned by a third photolithography process to form the source electrode 15 and the drain electrode 16, wherein the source electrode 15 and the drain electrode 16 are separated by a channel region by etching. Furthermore, the conventional thin film transistor could further comprise a passivation layer and an indium-tin-oxide (ITO) layer which are then patterned by a fourth and a fifth photolithography process, respectively. As manufacturing technique varies, there are four to six steps of photolithography processes in application. This prior art is focused on the structure of the conventional thin film transistor for gist description and is ignored about the other details and principles.

In the prior art as shown in FIG. 1, after forming the gate electrode in Ag, the gate electrode may peel due to the poor adhesion of silver to the substrate, resulting a yield loss. In addition, silver sensitively reacts with chloride, sulfur and sulfide during etching process, decreasing the electrical conductivity and thermal conductivity. Silver also easily agglomerate at moderate temperature during annealing, causing an increasing resistivity of silver. In order to manufacture high quantity thin film transistor, providing a conducting wire in Ag with low resistivity and good adhesion characteristics that are a key topic that R&D staffs must solve instantly.

SUMMARY OF THE INVENTION

Therefore, it is a primary objective of the present invention to provide a thin film transistor that comprises: a substrate, a gate electrode, a first adhesion layer, a gate insulating layer, a semiconductor layer, a source electrode and a drain electrode. The gate electrode is formed on the substrate, and the gate electrode is made of silver. The first adhesion layer is formed between the substrate and the gate electrode. The gate insulating layer is formed on the gate electrode. The semiconductor layer is formed on the gate insulating layer. The source/drain electrodes are formed on the partial semiconductor layer. Accordingly, the reliable thin film transistor is provided through having conducting wire in Ag with low resistivity and good adhesion characteristics by the first adhesion layer. Furthermore, the source/drain electrode could have good adhesion characteristics by the description afterward to let the present invention of thin film transistor having better quantity and stability.

DETAILED DESCRIPTION OF THE PREFERRED EMBODIMENTS

To make it easier for our examiner to understand the objective of the invention, its innovative features and performance, a detailed description and technical characteristics of the present invention are described together with the drawings as follows.

Figure 1:
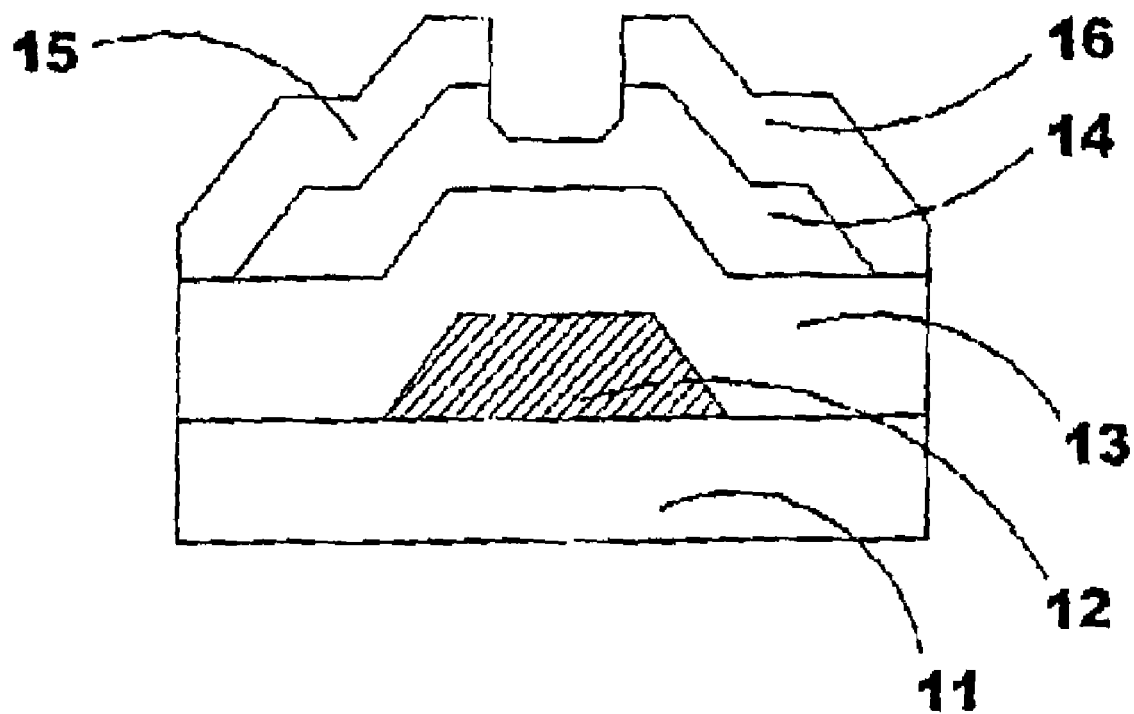
FIG. 1 is a schematic view of a conventional thin film transistor.
Figure 2:
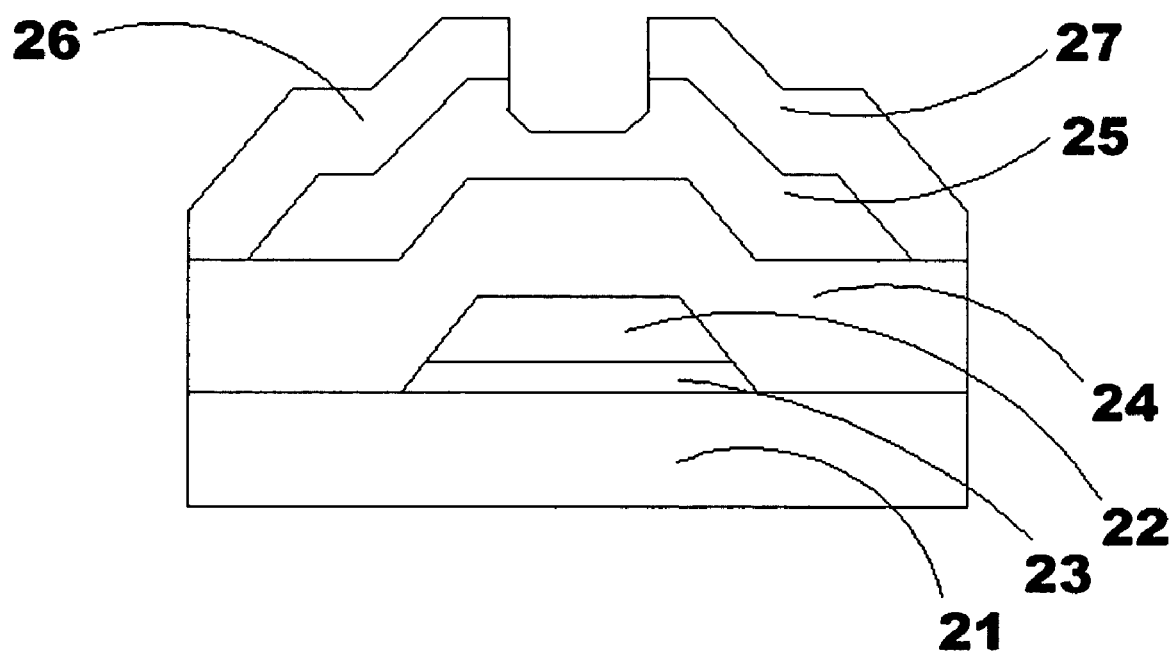
FIG. 2 is a schematic view of a thin film transistor according to an embodiment of the present invention.

Referring to FIG. 2, a schematic view of a thin film transistor according to an embodiment of the present invention is illustrated. In the preferred embodiment, the thin film transistor comprises: a substrate 21, a gate electrode 22, a first adhesion layer 23, a gate insulating layer 24, a semiconductor layer 25, a source electrode 26 and a drain electrode 27. The gate electrode 22 is formed on the substrate 21, and the gate electrode is made of silver. The first adhesion layer 23 is formed between the substrate 21 and the gate electrode 22, wherein the first adhesion layer 23 includes titanium (Ti), tantalum (Ta), nickel (Ni), chromium (Cr), tungsten (W), cobalt (Co), magnesium (Mg), vanadium (V), or combinations thereof, or also such as titanium nitride, tantalum nitride, tungsten nitride, titanium silicide, tantalum silicide, tungsten silicide, or combinations thereof. The gate insulator layer 24 is formed on the gate electrode 22. The semiconductor layer 25 is formed on the gate insulating layer 24. The source electrode 26 and the drain electrode 27 are formed on parts of the semiconductor layer 25.

Figure 3:
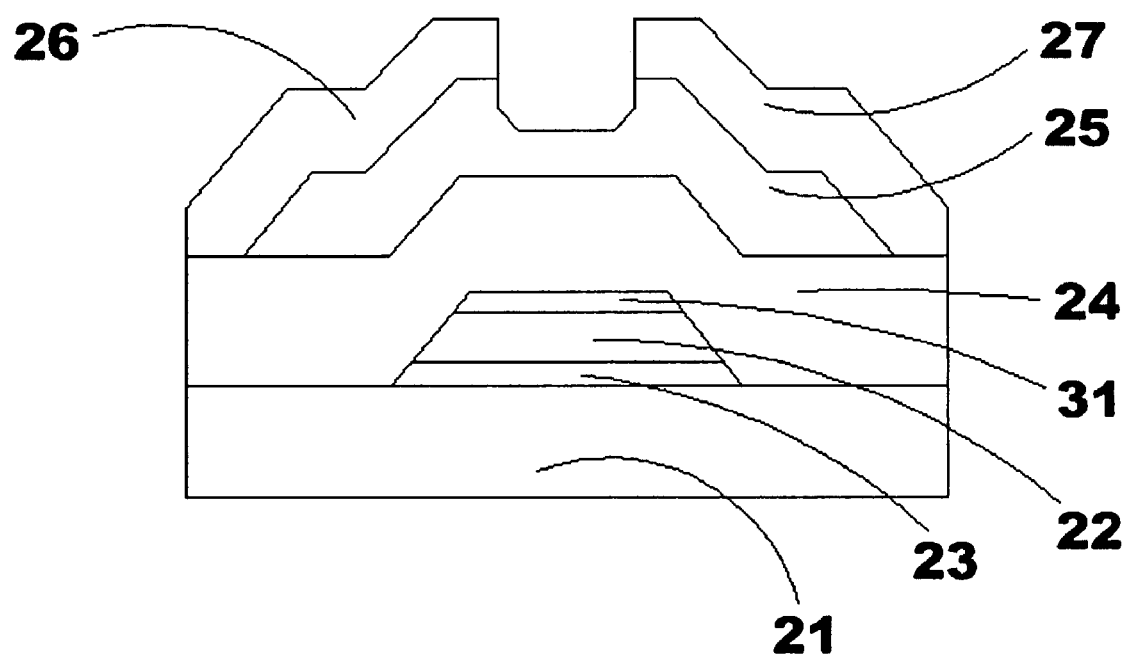
FIG. 3 is a schematic view of another thin film transistor according to an embodiment of the present invention.

Referring to FIG. 3, another schematic view of a thin film transistor according to an embodiment of the present invention is illustrated. In the preferred embodiment, the thin film transistor comprises: a substrate 21, a gate electrode 22, a first adhesion layer 23, a second adhesion layer 31, a gate insulating layer 24, a semiconductor layer 25, a source electrode 26 and a drain electrode 27. The gate electrode 22 is formed on the substrate 21, and the gate electrode is made of silver. The first adhesion layer 23 is formed between the substrate 21 and the gate electrode 22, wherein the first adhesion layer 23 includes titanium (Ti), tantalum (Ta), nickel (Ni), chromium (Cr), tungsten (W), cobalt (Co), magnesium (Mg), vanadium (V), or combinations thereof, or also such as titanium nitride, tantalum nitride, tungsten nitride, titanium silicide, tantalum silicide, tungsten silicide, or combinations thereof. The second adhesion layer 31 is formed between the gate electrode 22 and the gate insulating layer 24, wherein the second adhesion layer 31 includes titanium (Ti), tantalum (Ta), nickel (Ni), chromium (Cr), tungsten (W), cobalt (Co), magnesium (Mg), vanadium (V), or combinations thereof, or also such as titanium nitride, tantalum nitride, tungsten nitride, titanium silicide, tantalum silicide, tungsten silicide, or combinations thereof. The gate insulating layer 24 is formed on the gate electrode 22. The semiconductor layer 25 is formed on the gate insulating layer 24. The source electrode 26 and the drain electrode 27 are formed on parts of the semiconductor layer 25, and the material of the source electrode 26 and the drain electrode 27 includes silver or silver-alloy.

Figure 4:
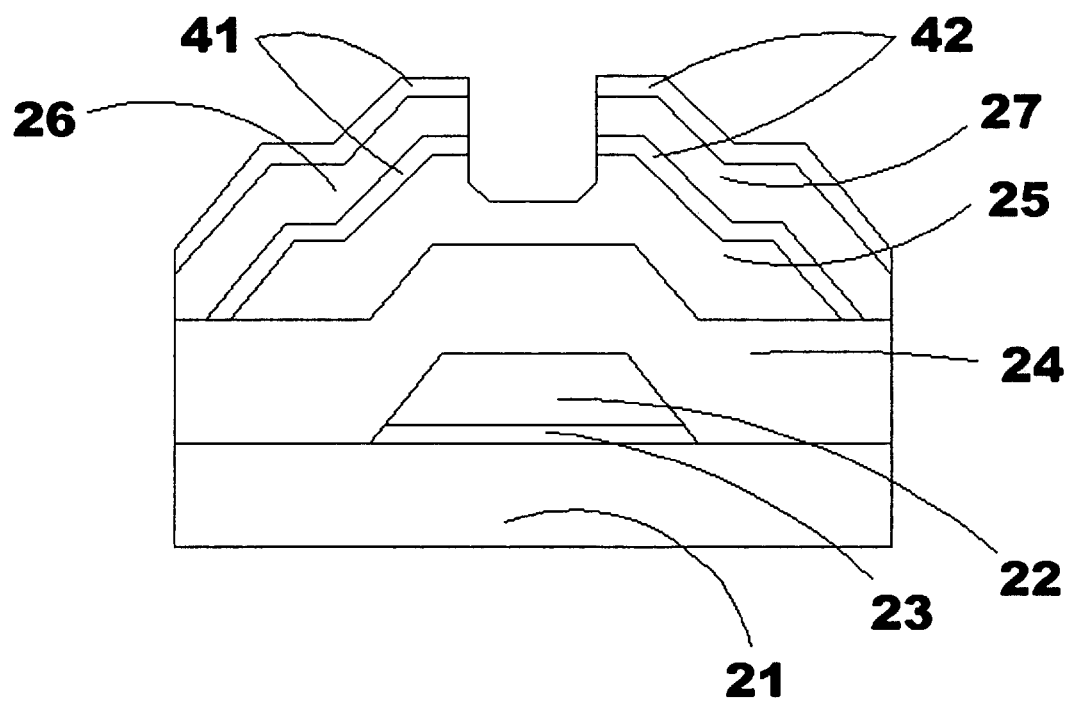
FIG. 4 is a schematic view of a further thin film transistor according to an embodiment of the present invention.

Referring to FIG. 4, a further schematic view of a thin film transistor according to an embodiment of the present invention is illustrated. In the preferred embodiment, the thin film transistor comprises: a substrate 21, a gate electrode 22, a first adhesion layer 23, a gate insulating layer 24, a semiconductor layer 25, a source electrode 26, a drain electrode 27, a third adhesion layer 41 and a fourth adhesion layer 42. The gate electrode 22 is formed on the substrate 21, and the gate electrode is made of silver. The first adhesion layer 23 is formed between the substrate 21 and the gate electrode 22, wherein the first adhesion layer 23 includes titanium (Ti), tantalum (Ta), nickel (Ni), chromium (Cr), tungsten (W), cobalt (Co), magnesium (Mg), vanadium (V), or combinations thereof, or includes titanium nitride, tantalum nitride, tungsten nitride, titanium silicide, tantalum silicide, tungsten silicide, or combinations thereof. The gate insulating layer 24 is formed on the gate electrode 22. The semiconductor layer 25 is formed on the gate insulating layer 24. The source electrode 26 and the drain electrode 27 are formed on parts of the semiconductor layer 25, and the material of the source electrode 26 and the drain electrode 27 includes silver or silver-alloy. The third adhesion layer 41 is formed between the source electrode 26 and the semiconductor layer 25, and/or is formed on the source electrode 26, wherein the third adhesion layer 41 includes titanium (Ti), tantalum (Ta), nickel (Ni), chromium (Cr), tungsten (W), cobalt (Co), magnesium (Mg), vanadium (V), or combinations thereof, or includes titanium nitride, tantalum nitride, tungsten nitride, titanium silicide, tantalum silicide, tungsten silicide, or combinations thereof. The fourth adhesion layer 42 is formed between the drain electrode 27 and the semiconductor layer 25, and/or is formed on the drain electrode 27, wherein the fourth adhesion layer 42 includes titanium (Ti), tantalum (Ta), nickel (Ni), chromium (Cr), tungsten (W), cobalt (Co), magnesium (Mg), vanadium (V), or combinations thereof, or includes titanium nitride, tantalum nitride, tungsten nitride, titanium silicide, tantalum silicide, tungsten silicide, or combinations thereof.

While the present invention has been described by way of example and in terms of a preferred embodiment, it is to be understood that the present invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the description above, the present invention is novel and useful and definite enhances the performance over the conventional structure and further complies with the patent application requirements and is submitted to the Patent and Trademark Office for review and granting of the commensurate patent rights.

We claim:

1. A thin film transistor, comprising:
   a substrate;
   a gate electrode formed on said substrate, said gate electrode being made of silver;
   a first adhesion layer formed to be disposed between said substrate and said gate electrode, wherein said first adhesion layer consists of a material selected from the group consisting of: tantalum (Ta), nickel (Ni), tungsten (W), cobalt (Co), magnesium (Mg), vanadium (V), tungsten nitride, tantalum nitride, tantalum silicide, tungsten silicide, titanium alloy, and combinations thereof;
   a gate insulating layer formed on said gate electrode;
   a second adhesion layer separately formed with respect to said first adhesion layer, and disposed between said gate electrode and said gate insulating layer;
   a semiconductor layer formed on said gate insulating layer; and
   a source electrode and a drain electrode formed on parts of said semiconductor layer.

2. The thin film transistor of claim 1, wherein said second adhesion layer is selected from the group consisting of: titanium (Ti), tantalum (Ta), nickel (Ni), tungsten (W), cobalt (Co), magnesium (Mg), vanadium (V), and combinations thereof.

3. The thin film transistor of claim 1, wherein said second adhesion layer is selected from the group consisting of: titanium nitride, tantalum nitride, tungsten nitride, titanium silicide, tantalum silicide, tungsten silicide, and combinations thereof.

4. The thin film transistor of claim 1, wherein said source electrode comprises silver or silver-alloy.

5. The thin film transistor of claim 4, further comprising a third adhesion layer separately formed with respect to said first and second adhesion layers, and disposed between said source electrode and said semiconductor layer and formed on said source electrode.

6. The thin film transistor of claim 4, further comprising a third adhesion layer separately formed with respect to said first and second adhesion layers, and disposed on said source electrode.

7. The thin film transistor of claim 6, wherein said third adhesion layer is selected from the group consisting of: titanium (Ti), tantalum (Ta), nickel (Ni), tungsten (W), cobalt (Co), magnesium (Mg), vanadium (V), and combinations thereof.

8. The thin film transistor of claim 6, wherein said third adhesion layer is selected from the group consisting of: titanium nitride, tantalum nitride, tungsten nitride, titanium silicide, tantalum silicide, tungsten silicide, and combinations thereof.

9. The thin film transistor of claim 4, further comprising a third adhesion layer separately formed with respect to said first and second adhesion layers, and disposed between said source electrode and said semiconductor layer.

10. The thin film transistor of claim 5, wherein said third adhesion layer is selected from the group consisting of: titanium (Ti), tantalum (Ta), nickel (Ni), tungsten (W), cobalt (Co), magnesium (Mg), vanadium (V), and combinations thereof.

11. The thin film transistor of claim 5, wherein said third adhesion layer is selected from the group consisting of: titanium nitride, tantalum nitride, tungsten nitride, titanium silicide, tantalum silicide, tungsten silicide, and combinations thereof.

12. The thin film transistor of claim 1, wherein said drain electrode comprises silver or silver-alloy.

13. The thin film transistor of claim 12, further comprising a fourth adhesion layer separately formed with respect to said first and second adhesion layers, and disposed between said drain electrode and said semiconductor layer and formed on said drain electrode.

14. The thin film transistor of claim 12, further comprising a fourth adhesion layer separately formed with respect to said first and second adhesion layers, and disposed on said drain electrode.

15. The thin film transistor of claim 14, wherein said fourth adhesion layer is selected from the group consisting of: titanium (Ti), tantalum (Ta), nickel (Ni), tungsten (W), cobalt (Co), magnesium (Mg), vanadium (V), and combinations thereof.

16. The thin film transistor of claim 14, wherein said fourth adhesion layer is selected from the group consisting of: titanium nitride, tantalum nitride, tungsten nitride, titanium suicide, tantalum silicide, tungsten silicide, and combinations thereof.

17. The thin film transistor of claim 12, further comprising a fourth adhesion layer separately formed with respect to said first and second adhesion layers, and disposed between said drain electrode and said semiconductor layer.

18. The thin film transistor of claim 13, wherein said fourth adhesion layer is selected from the group consisting of: titanium (Ti), tantalum (Ta), nickel (Ni), tungsten (W), cobalt (Go), magnesium (Mg), vanadium (V), and combinations thereof.

19. The thin film transistor of claim 13, wherein said fourth adhesion layer is selected from the group consisting of: titanium nitride, tantalum nitride, tungsten nitride, titanium silicide, tantalum silicide, tungsten suicide, and combinations thereof.

20. The thin film transistor of claim 1, wherein said titanium alloy is selected from the group consisting of: titanium nitride and titanium silicide.

21. A thin film transistor, comprising:
a substrate;
a gate electrode formed on said substrate, said gate electrode being made of silver;
a first adhesion layer formed to disposed between said substrate and said gate electrode, wherein said first adhesion layer consists of a material selected from the group consisting of: tantalum (Ta), nickel (Ni), tungsten (W), cobalt (Co), magnesium (Mg), vanadium (V), tungsten nitride thereof, tantalum nitride, tantalum silicide thereof, alloy thereof, tungsten silicide, titanium alloy, or combinations thereof;
a gate insulating layer formed on said gate electrode;
a semiconductor layer formed on said gate insulating layer; and
a source electrode and a drain electrode formed on parts of said semiconductor layer.

22. the thin film transistor of claim 21, wherein said source electrode comprises silver or silver-alloy.

23. The thin film transistor of claim 21, further comprising a second adhesion layer separately formed with respect to said first adhesion layer, and disposed between said source electrode and said semiconductor layer and formed on said source electrode.

24. The thin film transistor of claim 23, wherein said second adhesion layer is selected from the group consisting of: titanium (Ti), tantalum (Ta), nickel (Ni), tungsten (W), cobalt (Co), magnesium (Mg), vanadium (V), and combinations thereof.

25. The thin film transistor of claim 23, wherein said second adhesion layer is selected from the group consisting of: titanium nitride, tantalum nitride, tungsten nitride, titanium silicide, tantalum silicide, tungsten silicide, and combinations thereof.

26. The thin film transistor of claim 21, further comprising a second adhesion layer separately formed with respect to said first adhesion layer, and disposed on said source electrode.

27. The thin film transistor of claim 26, wherein said second adhesion layer is selected from the group consisting of: titanium (Ti), tantalum (Ta), nickel (Ni), tungsten (W), cobalt (Co), magnesium (Mg), vanadium (V), and combinations thereof.

28. The thin film transistor of claim 26, wherein said second adhesion layer is selected from the group consisting of: titanium nitride, tantalum nitride, tungsten nitride, titanium silicide, tantalum silicide, tungsten silicide, and combinations thereof.

29. The thin film transistor of claim 21, further comprising a second adhesion layer separately formed with respect to said first adhesion layer, and disposed between said source electrode and said semiconductor layer.

30. The thin film transistor of claim 21, wherein said drain electrode comprises silver or silver-alloy.

31. The thin film transistor of claim 30, further comprising a third adhesion layer separately formed with respect to said first adhesion layer, and disposed between said drain electrode and said semiconductor layer and formed on said drain electrode.

32. The thin film transistor of claim 30, further comprising a third adhesion layer separately formed with respect to said first adhesion layer, and disposed on said drain electrode.

33. The thin film transistor of claim 32, wherein said third adhesion layer is selected from the group consisting of: titanium (Ti), tantalum (Ta), nickel (Ni), tungsten (W), cobalt (Co), magnesium (Mg), vanadium (V), and combinations thereof.

34. The thin film transistor of claim 32, wherein said third adhesion layer is selected from the group consisting of: titanium nitride, tantalum nitride, tungsten nitride, titanium silicide tantalum silicide, tungsten silicide, and combinations thereof.

35. The thin film transistor of claim 30, further comprising a third adhesion layer separately formed with respect to said first adhesion layer, and disposed between said drain electrode and said semiconductor layer.

36. The thin film transistor of claim 31, wherein said third adhesion layer is selected from the group consisting of: titanium (Ti), tantalum (Ta), nickel (Ni), tungsten (W), cobalt (Co), magnesium (Mg), vanadium (V), and combinations thereof.

37. The thin film transistor of claim 31, wherein said third adhesion layer is selected from the group consisting of: titanium nitride, tantalum nitride, tungsten nitride, titanium silicide, tantalum silicide, tungsten silicide, and combinations thereof.

38. The thin film transistor of claim 21, wherein said titanium alloy is selected from the group consisting of: titanium nitride and titanium silicide.

* * * * *